*INVENTORS*
MARVIN BENNETT
WARREN E. BOYD
JOSEPH C. NOBILE

BY Joseph L. Spiegel
ATTORNEY

July 7, 1970 M. BENNETT ET AL 3,518,756

FABRICATION OF MULTILEVEL CERAMIC, MICROELECTRONIC STRUCTURES

Filed Aug. 22, 1967 2 Sheets-Sheet 2

1

3,518,756
FABRICATION OF MULTILEVEL CERAMIC, MICROELECTRONIC STRUCTURES

Marvin Bennett, Poughkeepsie, Warren E. Boyd, Newburgh, and Joseph C. Nobile, Cold Spring, N.Y., assignors to International Business Machines Corporation, Armonk, N.Y., a corporation of New York Filed Aug. 22, 1967, Ser. No. 662,444
Int. Cl. B41m 3/08; H05k 3/00
U.S. Cl. 29—625 1 Claim

ABSTRACT OF THE DISCLOSURE

Multilevel ceramic, microelectronic structures are fabricated by: forming a slip comprising ceramic particles and binder dispersed in a solvent; spreading and leveling the slip into thin films or tapes; punching via holes and cavities at predetermined locations in the tapes; metallizing surfaces of the tapes to form desired circuit patterns, a portion of the metallization being deposited in the via holes; stacking and registering the tapes; and, in one operation, laminating the tapes by the application of very high pressure into a monolithic structure, simultaneously cutting the tapes to a predetermined size and forming terminal holes.

BACKGROUND OF THE INVENTION

Field of the invention

The present invention relates to a multilevel ceramic circuitry and in particular to cutting green ceramic sheets to a desired module size and punching terminal holes during lamination of the sheets into a monolithic structure.

The advances presently being made in microelectronic devices are being deterred by certain inherent limitations in existing designs. The single insulating substrate, typically ceramic, with deposits of conductive material on one or both sides, allows limited conductive patterns. With the developments in integrated circuit technologies, it becomes increasingly apparent that corresponding advances must be made in wireability.

In efforts to achieve more complex, i.e. dense, circuitry, one approach has been to use multilevel ceramic, microelectronic structures, composite ceramic bodies having electrically connected conductive patterns that may exist at a plurality of distinct, horizontal levels.

Description of the prior art

A common method for fabricating such multilevel ceramic, microelectronic structures requires: forming ceramic material into a flexible tape; cutting the tape into sheets, referred to as green sheets; forming terminal holes and via holes at predetermined locations in the separate sheets; depositing electrode paste on the desired areas of the separate sheets and in the via holes; stacking the sheets one upon another; registering them; subjecting them to either moderate temperature and pressure or just to very high pressure for a period of time long enough to bond the sheets together into a monolithic structure; cutting the structure to desired module size; and, subjecting the laminate to ceramic firing temperatures to mature the ceramic and simultaneouly fire the screened paste to form conductors. At an appropriate point during the fabrication process, contact pins will be embedded in the terminal holes, for establishing an electrical path from these conductors to external circuitry.

The prior art method of cutting the unmatured sheets to desired module size after lamination has certain disadvantages. In mass production techniques it represents

2 one extra step. The structures so formed are characterized by a somewhat concave shape with ragged, feather edges. It will be appreciated that planar rather than concave shapes are required. Further, ragged edges, in cases where edge metallization is required, cannot be metallized. Also, structures formed with feather edges, after curing, tend to be very brittle, break quite easily, and cannot be used in automatic high speed handling and locating machinery.

It has also been suggested to cut the unmatured sheets to desired module size before lamination. The sheets are then stacked, registered, and laminated. This leads to entrapment of air and gives rise to voids in the resulting structure. The stack when laminated by this method tends to warp very badly. It is very difficult to coordinate punched size with the size of the laminating die and lamination pressure. If the punched part is too small, it tends to flow under heat and low pressure to fill the die cavity, thus resulting in a too thin structure, with disfigured holes. If, on the other hand, the pre-punched part is too large, air entrapment results due to bowing prior to application of pressure.

Similarly, prior art methods of forming terminal holes before, and in some instances after, lamination have an inherent registration problem. Where the terminal holes are formed beforehand, no matter how carefully the positioning of these holes has been, when a stack of sheets are aligned, there is always a certain amount of mismatch between the holes in the superimposed laminae. The mismatch is further complicated by the fact that during lamination, the superimposed laminae may expand at different rates and in different directions. Taking into consideration the size of the holes in the individual lamina, typically 22 mils in diameter, the attendant mismatch may, in a stack, completely close up the resulting terminal hole, thus preventing insertion of contact pins. The holes are quite small and are formed by punching with very small diameter pins. Thus, where hole formation follows lamination, there is danger of pin breakage. Drilling has also been suggested, but this leads to tearing and subsequent metallization difficulties, i.e. discontinuities.

SUMMARY OF THE INVENTION

Accordingly an object of the present invention is the elimination of a separate cutting step in the fabrication of multilevel ceramic, microelectronic modules.

Another object is the elimination of a separate terminal hole formation step in the fabrication of such modules.

Still another object is the reduction of differential shrinkage in the fabrication of such modules.

These and other objects are accomplished in accordance with the teachings of the present invention one illustrative embodiment of which comprises cutting to desired module size and forming terminal holes during cold lamination of a plurality of ceramic sheets into a monolithic structure.

BRIEF DESCRIPTION OF THE DRAWING

The foregoing and other objects, features and advantages of the present invention will be apparent from the following more particular description of the preferred embodiments of the invention as illustrated in the accompanying drawing, wherein.

DESCRIPTION OF THE PREFERRED EMBODIMENTS

Figure 1:
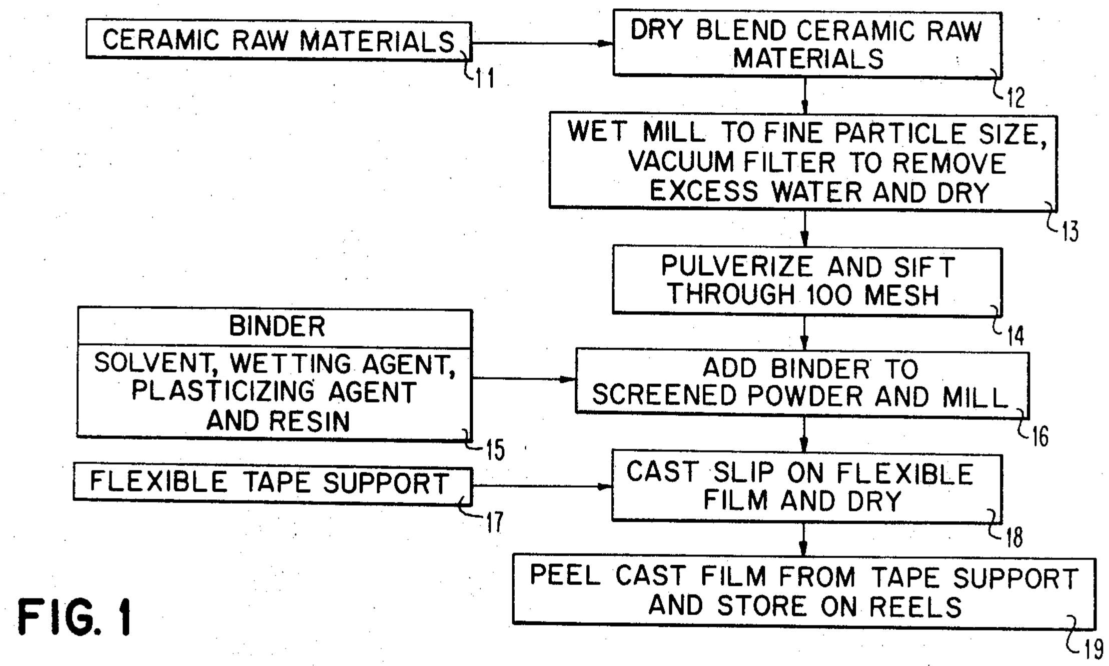
FIG. 1 is a flow diagram illustrating the operations performed and materials used in forming a green ceramic tape.

A wide variety of structures can be made according to the teachings of the present invention. The fabrication of a multilevel ceramic, microelectronic structure will first be described with reference to the drawing, starting with the block diagram of FIG. 1.

Ceramic raw materials 11 are first dry blended in operation 12. A wide variety of ceramic raw materials may be used, for example, alumina, zircon, aluminum silicates, zirconium dioxide, titanium dioxide, magnesium silicates, barium titanate, and various combinations thereof. Such materials are preferred, but are only examples of raw materials that may be employed. In one particular embodiment the constituents comprised, in parts by weight, 89% $Al_2O_3$, 8.25% $SiO_2$, 1.32% MgO and 1.43% CaO. Other materials found to be satisfactory are described in more detail in a U.S. patent application of McIntosh, entitled "Ceramic Compositions and Fired Ceramic Bodies," Ser. No. 626,788, filed Mar. 29, 1967, and assigned to the same assignee as the present invention.

Following this, the particles are wet milled to fine particle size (operation 13), typically 0.2 to 2.5 microns, vacuum filtered to remove excess water and then allowed to dry.

In the next step 14, the material is pulverized so that all particles will pass through a minus 100 mesh screen. Then, an organic binder 15 consisting of a solvent, typically alcohol, toluene, etc., a wetting agent, typically alkyl ether of polyethylene glycol sold under the trade name of "Tergitol" by Carbide and Carbon Chemicals Company, a plasticizing agent typically di-butyl-pthalate and a resin, typically polyvinyl butyral, are added to the powder resulting from the previous operation in an approximate 1–2 to 1 powder to binder ratio, and milled to form a homogeneous suspension (operation 16). Aqueous binders may also be used.

During the milling operation the slip, as the suspension is now referred to, is checked for its viscosity, specific gravity and on a paint gauge to detect agglomerates. The specific gravity depends on the ceramic, while viscosity is approximately 1000–1500 centiposes. With the milling completed, the slip is ready to be cast.

One common method calls for depositing the slip on a smooth flexible moving tape support 17 such as polytetrafluoroethylene ("Teflon") or polyethylene terephthalate ("Mylar"). The support is clean, smooth and has an impervious surface. The slip is spread and leveled by means of a doctor blade into a thin layer or film, typically 3–20 mils thick and then dried in situ (operation 18).

In the next operation 19, the cast film is peeled from the tape support and checked for thickness, pinholes and cracks. The peeled film is then allowed to stand for an additional period to assure that all volatile constituents have evaporated from the film. Assuming that the steps have been carried out properly, the cast film will be pinhole free, of uniform thickness and have an optimized green density of 1.5–3.0 gms./cc. depending on the ceramic. It is extremely flexible and handles somewhat like an oil cloth, with the binders holding the ceramic particles together. The cast film, referred to as being in its green state, is now ready for immediate further processing or may be taken up on reels and stored until required. Alternatively, the ceramic tape may be taken up on reels with the tape support, still in place, to be peeled off at a later time.

Figure 2:
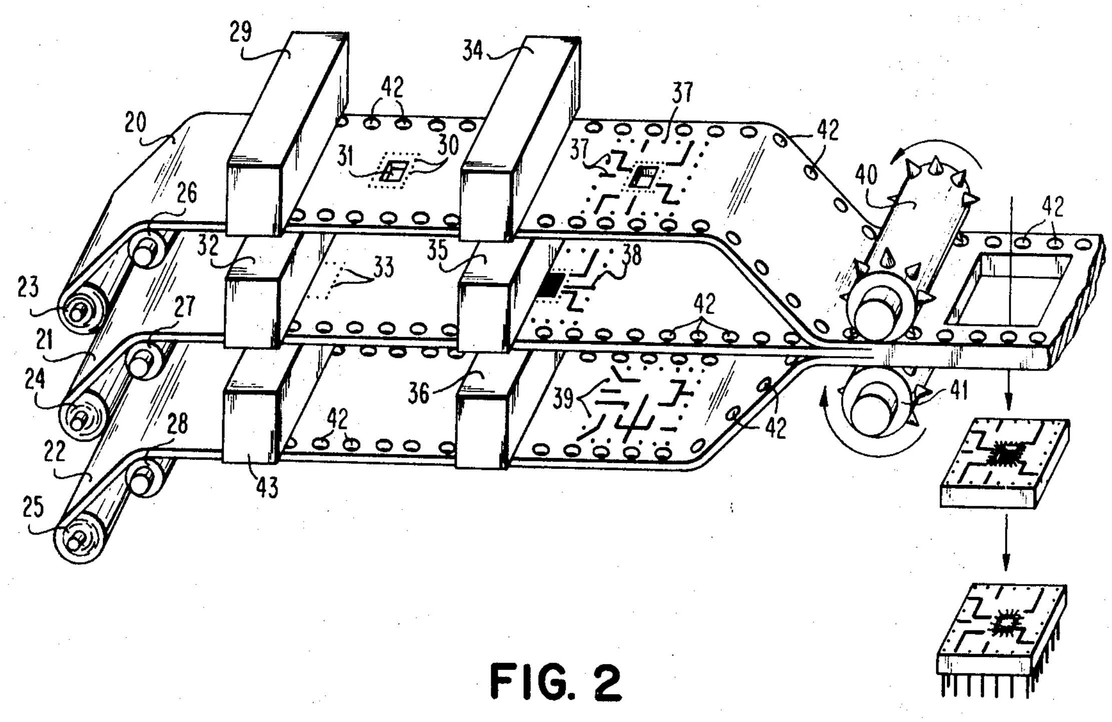
FIG. 2 is a schematic illustration of the formation of a multilevel ceramic microelectronic structure from green ceramic tapes.

Reference is now had to the schematic illustration of FIG. 2 in which dried ceramic tapes or films 20, 21, 22 are fed concurrently from supply reels 23, 24, 25 over guide rollers 26, 27, 28. The tapes are typically 2" wide and, as previously stated, 3–20 mils thick.

As the tapes move, they are punched at predetermined locations to form via holes, and, if desired, semiconductor chip cavities. Thus, in FIG. 2 the tape 20 is run through a first punch press 29 to provide via holes 30 and openings 31 while a second press 32 forms in tape 21, via holes 33 adapted to be placed subsequently in registry with holes 31 in tape 20. Typically, these via holes measure 5 mils on 30–35 mil centers, although 4 mil holes on 8 mil centers are regularly achieved.

Thereafter, electrode paste containing, for example, the refractory metals such as tungsten, molybdenum, etc., the noble metals such as platinum, palladium, alloys thereof, and the like, are deposited by means of silk screen printers 34, 35, 36 on the desired surfaces of the separate green ceramic tapes 20–22, to form the desired circuit patterns 37, 38, 39. For lower firing ceramics, lower melting point materials, as silver, can be used.

After sintering, this paste yields good conductivity and adheres well to the ceramic. The sintered line widths average 6 mils.

A portion of the paste is squeezed into the previously punched via holes and also, if desirable, in the cavity and where terminal holes are to be formed. The conductive material in the via holes will electrically connect the conductive patterns located at distinct horizontal levels within the to be formed monolithic structure. The paste is then allowed to dry. Other metallization methods may be used, as spraying, plating, pouring, etc. Thus, where the to be formed structure will include cavities for subsequent reception of a semiconductive chip element the bottom of the cavity may be metallized by evaporation to form a bonded layer between the substrate and chip element. This technique is described in more detail in U.S. Pat. 3,325,282 of Chiou et al., issued June 20, 1967. Also, if desired, resistors, inductors, capacitors, etc. can be formed during this operation.

Continuing along the process path, the tapes are next fed through a pair of presure rollers 40, 41. The rollers are provided with sprockets 42 to mate with spaced registration holes or openings 43 formed along the outer edges of the respective tapes 20–22.

Normally, these outer edge openings 43 are punched in the tapes during via hole and cavity formation by the presses 29, 32 and 44. Thus, the rollers 40, 41 contribute to alignment of the tapes with respect to each other and bring them together in surface to surface contact. For alignment and registration purposes, additional sprocket wheels (not shown) are found along the process path at spaced intervals.

The tapes are then fed together into a punch press for lamination and through-hole formation. Reference will now be had to FIG. 3 which is a series of progressive side views showing cutting, terminal hole formation and lamination of the ceramic tapes 20–22. The press 51 comprising a body material, for example, steel, has a rectangular cavity 52 whose length and width are those of the approximate desired module size. The press includes a lower die 53 having a plurality of vertical channels 54 and a plurality of punches 55 slidably held within the channels 54. The number and cross section of the punches are the same as those of the desired terminal holes. The press further includes an upper die 56 provided with a plurality of channels 57 in registry with and for reception of the punches 55.

Figure 3A:
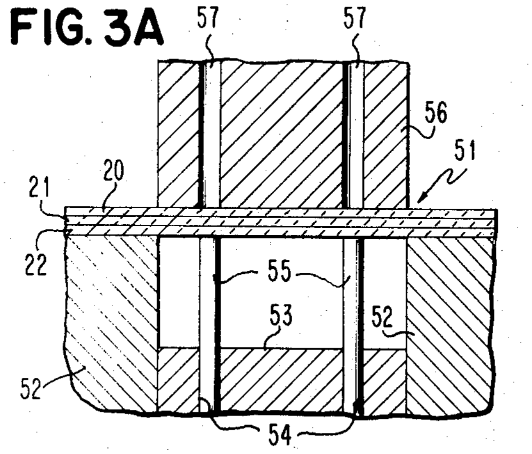
FIG. 3 is a series of progressive side views showing cutting, terminal hole formation and lamination of ceramic tapes.

FIG. 3A illustrates the tapes in position with upper die 56 just touching the upper surface of tape 20.

Figure 3B:
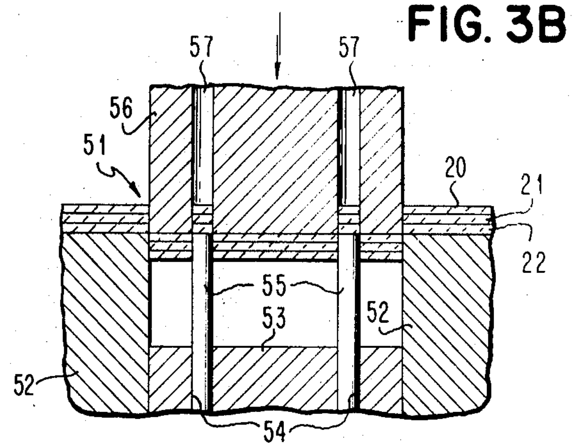

In FIG. 3B the upper die 56 is lowered bringing sufficient pressure to bear upon the tapes to cut through them. The force may be applied mechanically or pneumatically for even transmission by the die members to the tapes. Simultaneously, punches 55 are raised to form terminal holes, and force the punched material into the channels 57 in the upper die 56.

Figure 3C:
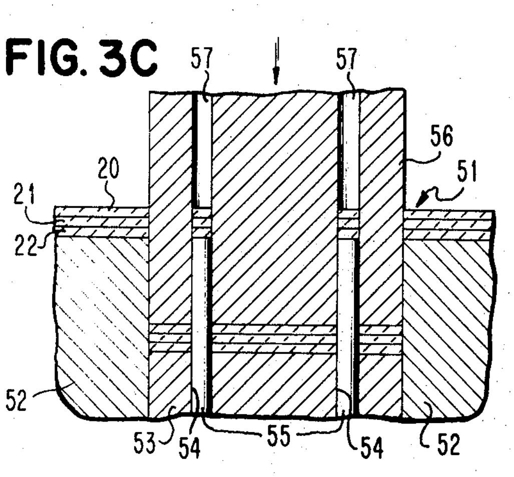

The upper die 56 continues its downward motion until, as shown in FIG. 3C, the punched tapes have bottomed on the lower die 53; thus bringing more pressure to bear on the tapes. At this point the tapes have started to flow under pressure and even out in density.

Figure 3D:
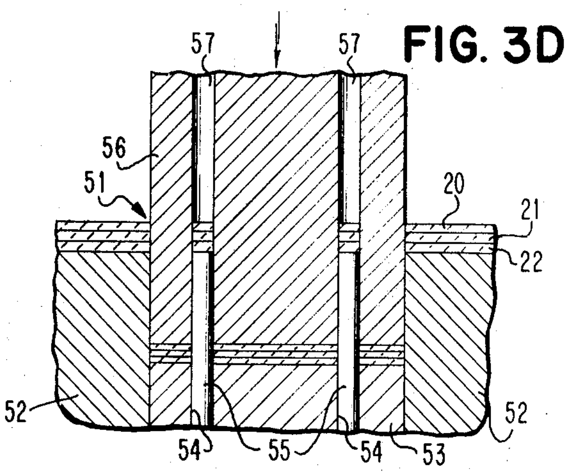

In FIG. 3D full pressure is brought to bear, typically 10,000–40,000 lbs./in. giving full flow to the ceramic which flows around the punches and against the sidewalls of the cavity to give straight, square sides and smooth walled terminal holes. The interfaces between the separate tapes are no longer detectable. Most modules experience differential shrinkage during firing, that is, the tendency to shrink more in one direction than another. The high pressure lamination substantially eliminates this condition, as well as evens out density differences. Higher lamination pressures are preferred as the higher the pressure the lower the differential shrinkage.

Figure 3E:
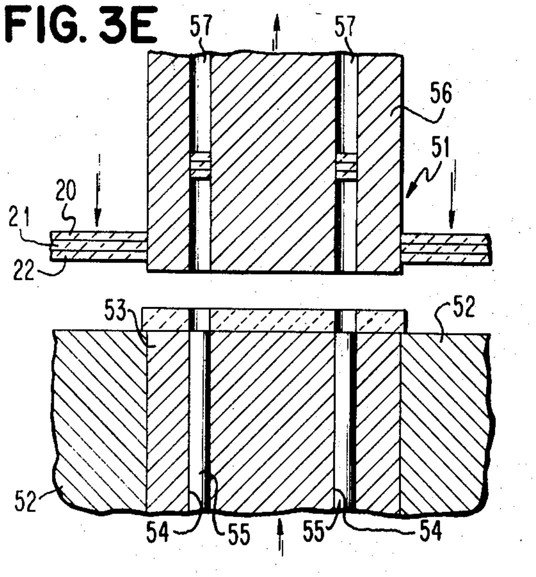

In FIG. 3E the lower die 53 raises up until it is flush with the top of the cavity 52. This ejects the monolithic laminate from the punch press 51. It is noted that the piece when ejected grows transversely, typically 0.5% so that it will not fit back into the cavity. The amount of growth is even, and reproducible and thus can be held to very close tolerances. The stacked tapes cling to the upper die, allowing for removal of the monolithic structure.

Figure 3F:
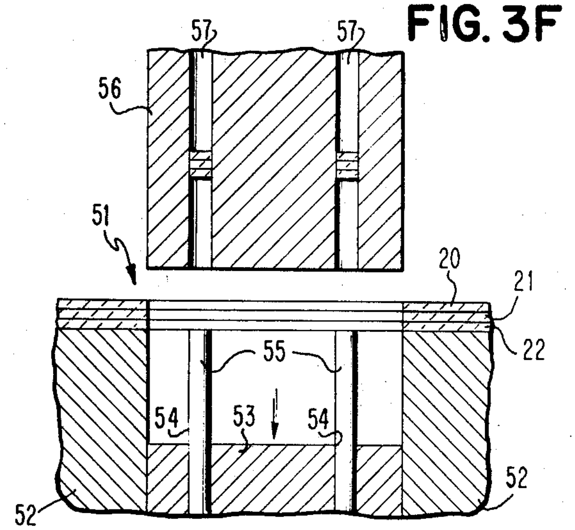

Finally, in FIG. 3F, the dies are back in position, ready to go through another cycle.

Subsequent to lamination, contact pins are embedded in the contact holes for completing conductive paths from the electrode patterns to external circuitry. Depending of the ceramic material used, the pins will be inserted before or after firing.

Thereafter, the composition structure is fired in an appropriate atmosphere the effect of which is to: burn off the binder, which initially served to bind the ceramic and metal materials together, and any remaining volatile constituents, typically at the 500–600° C. region; mature or vitrify the body; fire the screened electrodes; and intimately bond them to the ceramic; and, if they have been inserted, embed the contact pins. The structure or module fires to a flat, dense and cohesive body. The ceramic particles have coalesced to fill in the voids left by removal of organic resin during binder burn off. At the same time the metal densifies and becomes electrically conductive.

The module structure is now ready for subsequent operations, i.e. pinning, if required, tinning, active and passive chip device joining, interconnection, encapsulation, etc., as shown schematically in FIG. 2.

While the invention has been particularly shown and described with reference to the preferred embodiments thereof, it will be understood by those skilled in the art that the foregoing and other various changes in form and details may be made therein without departing from the spirit and scope of the invention.

What is claimed is:

1. A continuous process for forming a monolithic ceramic structure from a plurality of tapes comprising ceramic particulate material dispersed in a binder, comprising:

advancing said tapes in spaced relation to an assembly position;

punching via holes at predetermined locations in said tapes, in their passage to said assembly position;

depositing metallic material on surface areas of said tapes in a desired pattern and within said via holes, in their passage to said assembly position;

bringing the punched and metallized portions of said tapes together into surface contact and into alignment at said assembly position such that patterns on and via holes in different tapes are superposed in a desired relationship; and, in one operation, laminating said tape portions together by the application of very high pressure while confining lateral motion of said tape portions, simultaneously cutting said aligned portions to a predetermined size and forming contact holes extending through one or more of said cut tape portions.

References Cited

UNITED STATES PATENTS

| | | | |
|---|---|---|---|
| Re. 26,421 | 7/1968 | Rodriquez et al. | |
| 3,079,672 | 3/1963 | Bain et al. | 29—625 |
| 2,912,748 | 11/1959 | Gray. | |
| 2,925,645 | 2/1960 | Bell et al. | |
| 2,953,247 | 9/1960 | Walter et al. | 29—630 XR |
| 2,972,003 | 2/1961 | Greenman et al. | |
| 2,986,804 | 6/1961 | Greenman et al. | 29—625 |
| 3,037,265 | 6/1965 | Kollmeier | 29—625 |

CHARLIE T. MOON, Primary Examiner

R. W. CHURCH, Assistant Examiner

U.S. Cl. X.R.

204—15, 22; 29—628, 420, 420.5; 264—145, 61 58; 156—150, 151, 89; 29—25.42, 25.35, 620, 530; 174—68.5; 117—212; 336—200, 205